US011663457B2

(12) United States Patent
Song

(10) Patent No.: US 11,663,457 B2
(45) Date of Patent: May 30, 2023

(54) NEURAL NETWORK CIRCUITS HAVING NON-VOLATILE SYNAPSE ARRAYS

(71) Applicant: ANAFLASH INC., Sunnyvale, CA (US)

(72) Inventor: Seung-Hwan Song, Palo Alto, CA (US)

(73) Assignee: Anaflash Inc., Sunnyvale, CA (US)

( * ) Notice: Subject to any disclaimer, the term of this patent is extended or adjusted under 35 U.S.C. 154(b) by 0 days.

(21) Appl. No.: 17/737,342

(22) Filed: May 5, 2022

(65) Prior Publication Data

US 2022/0261624 A1 Aug. 18, 2022

Related U.S. Application Data

(62) Division of application No. 16/196,617, filed on Nov. 20, 2018, now Pat. No. 11,361,215.

(Continued)

(51) Int. Cl.
*G06N 3/063* (2023.01)
*G11C 16/04* (2006.01)
(Continued)

(52) U.S. Cl.
CPC .............. *G06N 3/063* (2013.01); *G11C 11/54* (2013.01); *G11C 16/0408* (2013.01);
(Continued)

(58) Field of Classification Search
CPC .................................................. G11C 16/0441
See application file for complete search history.

(56) References Cited

U.S. PATENT DOCUMENTS 4,950,917 A 8/1990 Holler et al.
9,373,395 B1 * 6/2016 Augustine ............ G11C 11/1673
(Continued)

FOREIGN PATENT DOCUMENTS

KR 2013/0133111 12/2013
WO 0301285 2/2003

OTHER PUBLICATIONS

PCT international Search Report and Written Opinion for International Application No. PCT/US18/62236, dated Apr. 24, 2019.
(Continued)

*Primary Examiner* — Douglas King

(57) ABSTRACT

A non-volatile synapse circuit of a non-volatile neural network. The synapse includes: a first input signal line for providing a first input signal; a reference signal line for providing a reference signal; first and second output lines for carrying first and second output signals therethrough, and first and second cells for generating the first and second output signals, respectively. Each of the first and second cells includes: a first upper select transistor having a gate that is electrically coupled to the first input signal line; and a first resistive changing element having one end connected to the first select transistor in series and another end electrically coupled to the reference signal line. The value of the first resistive changing element may be programmable to change the magnitude of an output signal. The drain of the first upper select transistor of the first cell is electrically coupled to the first output line and the drain of the first upper select transistor of the second cell is electrically coupled to the second output line.

11 Claims, 13 Drawing Sheets

Related U.S. Application Data

(60) Provisional application No. 62/655,074, filed on Apr. 9, 2018, provisional application No. 62/620,947, filed on Jan. 23, 2018, provisional application No. 62/592,300, filed on Nov. 29, 2017.

(51) Int. Cl.
  *G11C 11/54* (2006.01)
  *G11C 16/34* (2006.01)
  *G11C 16/10* (2006.01)
  *G11C 16/26* (2006.01)
  *G11C 16/16* (2006.01)

(52) U.S. Cl.
  CPC .............. *G11C 16/10* (2013.01); *G11C 16/16* (2013.01); *G11C 16/26* (2013.01); *G11C 16/34* (2013.01)

(56) References Cited

U.S. PATENT DOCUMENTS

| | | | |
|---|---|---|---|
| 9,715,916 B1* | 7/2017 | Tomishima | G11C 11/1673 |
| 10,417,559 B2* | 9/2019 | Hosokawa | G06N 3/049 |
| 2003/0095426 A1* | 5/2003 | Hush | G11C 11/16 |
| | | | 365/148 |
| 2003/0183871 A1 | 10/2003 | Dugger | |
| 2004/0037112 A1* | 2/2004 | Ooishi | G11C 29/816 |
| | | | 365/63 |
| 2005/0125477 A1* | 6/2005 | Genov | G06N 3/063 |
| | | | 708/607 |
| 2006/0209585 A1* | 9/2006 | Tanizaki | G11C 13/004 |
| | | | 365/148 |
| 2007/0159876 A1* | 7/2007 | Sugibayashi | G11C 11/16 |
| | | | 365/158 |
| 2008/0019192 A1* | 1/2008 | Wang | G11C 7/062 |
| | | | 365/189.06 |
| 2008/0205144 A1* | 8/2008 | Yamamoto | H01L 27/11558 |
| | | | 257/E27.103 |
| 2008/0225601 A1* | 9/2008 | Ratnakumar | G11C 16/0441 |
| | | | 257/E27.103 |
| 2009/0201742 A1* | 8/2009 | Lee | G11C 16/0441 |
| | | | 257/E29.345 |
| 2010/0067289 A1* | 3/2010 | Fuji | G11C 8/16 |
| | | | 365/163 |
| 2011/0317492 A1* | 12/2011 | Yao | G11C 16/0441 |
| | | | 365/185.28 |
| 2012/0020159 A1* | 1/2012 | Ong | G11C 14/0081 |
| | | | 365/185.08 |
| 2013/0328117 A1* | 12/2013 | Hommelgaard | H01L 27/11524 |
| | | | 438/258 |
| 2014/0289179 A1 | 9/2014 | Di Castro et al. | |
| 2015/0028278 A1* | 1/2015 | Lee | H01L 29/512 |
| | | | 257/2 |
| 2015/0085585 A1* | 3/2015 | Horch | H01L 27/11558 |
| | | | 365/185.28 |
| 2015/0279439 A1* | 10/2015 | Pyo | G11C 7/062 |
| | | | 365/158 |
| 2015/0311219 A1* | 10/2015 | Taniguchi | H01L 27/11558 |
| | | | 257/300 |
| 2016/0048755 A1 | 2/2016 | Freyman et al. | |
| 2016/0111163 A1 | 4/2016 | Wong | |
| 2016/0155048 A1* | 6/2016 | McCormick | G06N 3/04 |
| | | | 706/27 |
| 2016/0203400 A1 | 7/2016 | Kim et al. | |
| 2016/0336052 A1 | 11/2016 | Bernard-Granger et al. | |
| 2016/0372518 A1* | 12/2016 | Li | H01L 43/08 |
| 2019/0042199 A1* | 2/2019 | Sumbul | G11C 11/404 |
| 2019/0122105 A1* | 4/2019 | Boybat Kara | G06N 3/063 |
| 2021/0150317 A1* | 5/2021 | Hou | G06N 3/08 |

OTHER PUBLICATIONS

European Search Report for EP 18884830.3, dated Sep. 28, 2021.

Geoffrey W. Burr, "Neuromorphic computing using non-volatile memory", Advances in Physics: X vol. 2, 2017, 89-124, published on Dec. 4, 2016 [online] URL <https://www.tandfonline.com/doi/full/10.1080/23746149.2016.1259585>.

Kim M et al, "A 68 Parallel Row Access Neuromorphic Core with 22K Multi-Level Synapses Based on Logic-Compatible Embedded Flash Memory Technology" 2018 IEEE International Electron Devices Meeting (IEDM), IEEE, Dec. 1, 2018.

\* cited by examiner

900

| | Programming Methods: Pulse Height (Width) | | |
|---|---|---|---|
| | 910 (Prior Art) | 912 (Present method) | 914 (Prior Art) |
| Step 1 | VPGM (T_pulse) | VPGM (T_pulse*m) | VPGM (T_pulse) |
| Step 2 | VPGM+delta (T_pulse) | VPGM+delta (T_pulse) | VPGM (T_pulse) |
| Step 3 | VPGM+delta*2 (T_pulse) | VPGM+delta*2 (T_pulse) | VPGM (T_pulse) |
| Step 4 | VPGM+delta*3 (T_pulse) | VPGM+delta*3 (T_pulse) | VPGM (T_pulse) |

1000

| Step | Pulse Height (Width) |
|---|---|
| 1 | VPGM (T_pulse*m) |
| 2 | VPGM + delta (T_pulse) |
| 3 | VPGM + delta*2 (T_pulse) |
| 4 | VPGM + delta*3 (T_pulse) |
| 5~19 | VPGM - alpha (T_pulse*n) |

NEURAL NETWORK CIRCUITS HAVING NON-VOLATILE SYNAPSE ARRAYS

CROSS-REFERENCE TO PRIOR APPLICATIONS

This is a Divisional application of U.S. patent application Ser. No. 16/196,617, filed on Nov. 20, 2018, titled "Neural Network Circuits Having Non-Volatile Synapse Arrays," which claims priority of U.S. Patent Application Nos. 62/592,300, 62/620,947 and 62/655,074, filed on Nov. 29, 2017, Jan. 23, 2018, and Apr. 9, 2018, respectively, which are all hereby incorporated by reference in their entirety.

BACKGROUND

A. Technical Field

The present invention relates to neural network circuits, and more particularly, to neural network circuits having non-volatile synapse arrays using analog values.

B. Background of the Invention

An Artificial Neural Network (ANN) is a neural network that mimics a computational model of the human brain. A neural network can be described as many neurons connected with each other through synapses between them. The strengths of the connections, or the weight parameter of each synapse, can be adjusted through a learning process as a trainable parameter. In recent years, artificial intelligence (AI) using ANNs have been applied to various fields, such as visual and audio detection/recognition, language translation, gaming, medical decision-making, financial or weather forecasting, drones, autonomous driving cars, and etc.

Traditionally, computation of neural networks requires high performance cloud servers having multiple central processing units (CPUs) and/or graphics processing units (GPUs), since the complexity of computation prohibits mobile devices from running AI program locally due to the limited power and computation resource of the mobile devices. Other existing application-specific integrated circuit (ASIC) or field-programmable gate array (FPGA) approaches that accelerate computation of neural network with dedicated complementary metal-oxide-semiconductor (CMOS) logic can be power efficient compared to such generic CPU and GPU based approaches, but still wastes unnecessary power and latency to move data to and from the separate off-chip non-volatile memory (NVM) where the trained weight parameters are stored. As such, there is a need for neural network circuits that consume significantly less computational resources.

SUMMARY OF THE DISCLOSURE

In one aspect of the present invention, a non-volatile synapse circuit, includes: a first input signal line for providing a first input signal, a reference signal line for providing a reference signal, first and second output lines for carrying first and second output signals, and first and second cells for generating the first and second output signals, respectively. Each of the first and second cells includes a first upper select transistor, having a gate that is electrically coupled to the first input signal line, and a first resistive changing element with one end connected to the first upper select transistor in series and an other end electrically coupled to the reference signal line, with a value of the first resistive changing element being programmable to change a magnitude of an output signal. A drain of the first upper select transistor of the first cell is electrically coupled to the first output line and a drain of the first upper select transistor of the second cell is electrically coupled to the second output line.

A method for programming a threshold voltage (VTH) of a floating gate in a non-volatile synapse that includes a pair of transistors arranged to have a floating gate node, includes: applying a first electrical pulse across the pair of transistors, the first electrical signal having a first height and a first width; and then applying a first sequence of pulses across the pair of transistors while increasing a height of each pulse from a previous pulse by a preset value, with each pulse of the first sequence of pulses having a second width that is narrower than the first width. This results in programming a voltage on the floating gate node.

In another aspect of the present invention, a non-volatile neural network includes: a first neural array layer including a first plurality of neurons; a second neural array layer including a second plurality of neurons; and a synapse array layer disposed between the first and second neural array layers and including a plurality of non-volatile synapses. Each non-volatile synapse in the synapse array layer is electrically coupled to a neuron of the first plurality of first neurons and to one or more neurons of the second plurality of neurons, and includes: a first input signal line for receiving a first input signal from a neuron in the first plurality of neurons; a reference signal line for providing a reference signal; first and second output lines for carrying first and second output signals therethrough, the first and second output signals being processed and transmitted to one or more neurons of the second plurality of neurons; and first and second cells for generating the first and second output signals, respectively. Each of the first and second cells includes a first upper select transistor, having a gate that is electrically coupled to the first input signal line, and a first resistive changing element with one end connected to the first upper select transistor in series and an other end electrically coupled to the reference signal line, with a value of the first resistive changing element being programmable to change a magnitude of an output signal. A drain of the first upper select transistor of the first cell is electrically coupled to the first output line and a drain of the first upper select transistor of the second cell is electrically coupled to the second output line.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for the purposes of explanation, specific details are set forth in order to provide an understanding of the disclosure. It will be apparent, however, to one skilled in the art that the disclosure can be practiced without these details. One skilled in the art will recognize that embodiments of the present disclosure, described below, may be performed in a variety of ways and using a variety of means. Those skilled in the art will also recognize additional modifications, applications, and embodiments are within the scope thereof, as are additional fields in which the disclosure may provide utility. Accordingly, the embodiments described below are illustrative of specific embodiments of the disclosure and are meant to avoid obscuring the disclosure.

A reference in the specification to "one embodiment" or "an embodiment" means that a particular feature, structure, characteristic, or function described in connection with the embodiment is included in at least one embodiment of the disclosure. The appearance of the phrase "in one embodiment," "in an embodiment," or the like in various places in the specification are not necessarily all referring to the same embodiment.

Figure 1:
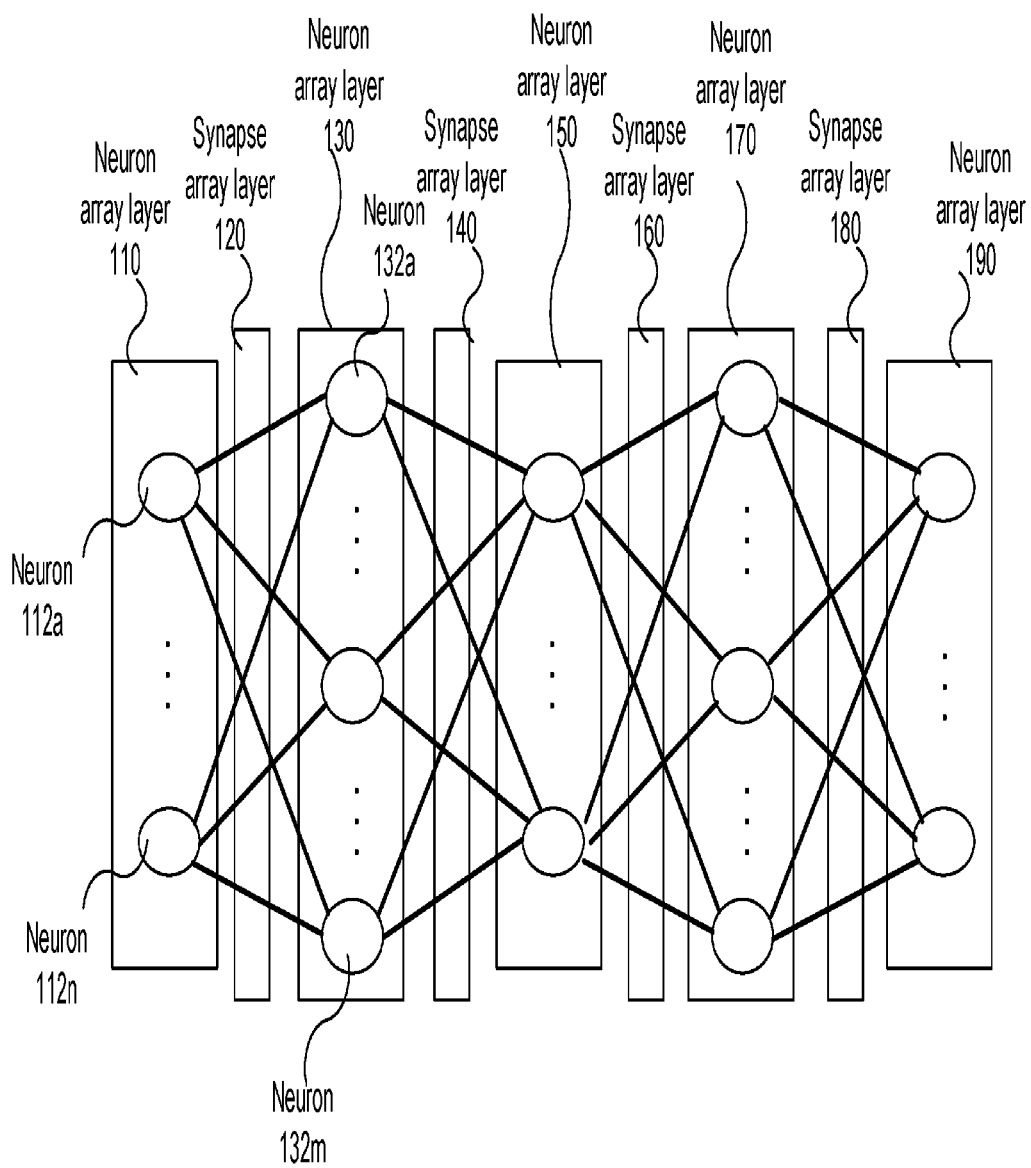
FIG. 1 shows a schematic diagram of a neural network according to embodiments of the present disclosure.

FIG. 1 shows a schematic diagram of a neural network 100 according to embodiments of the present disclosure (like reference numerals denote like elements throughout the specification). As depicted, the neural network 100 may include five neuron array layers (or shortly, neuron layers) 110, 130, 150, 170 and 190, and synapse array layers (or shortly, synapse layers) 120, 140, 160 and 180. Each of the neuron layers (e.g., 110) may include a suitable number of neurons. In FIG. 1, only five neuron layers and four synapse layers are shown. However, it should be apparent to those of ordinary skill in the art that the neural network 100 may include other suitable numbers of neuron layers and a synapse layer may be disposed between two adjacent neuron layers.

It is noted that each neuron (e.g., 112a) in a neuron layer (e.g., 110) may be connected to one or more of the neurons (e.g., 132a-132m) in the next neuron array layer (e.g., 130) through m synapses in a synapse layer (e.g., 120). For instance, if each of the neuron in the neuron layer 110 is electrically coupled to all the neurons in the neuron layer 130, synapse layer 120 may include n×m synapses. In embodiments, each synapse may have a trainable weight parameter (w) that describes the connection strength between two neurons.

In embodiments, the relationship between input neuron signals (Ain) and output neuron signals (Aout) may be described by an activation function with the following equation:

$$Aout = f(W \times Ain + \text{Bias}). \qquad (1)$$

where, Ain and Aout are matrices representing input signals to a synapse layer and output signals from the synapse layer, respectively, W is a matrix representing the weights of synapse layer, and Bias is a matrix representing the bias signals for Aout. In embodiments, W and Bias may be trainable parameters and stored in a logic friendly non-volatile memory (NVM). For instance, a training/machine leaning process may be used with known data to determine W and Bias. In embodiments, the function f may be a non-linear function, such as sigmoid, tan h, ReLU, leaky ReLU, etc. In embodiments, Aout may be activated when (W×Ain+Bias) is greater than a certain threshold.

By way of example, the relationship described in equation (1) may be illustrated for neuron layer 110 having two neurons, synapse layer 120, and neuron layer 130 having three neurons. In this example, Ain representing output signals from the neuron array layer 110 may be expressed as a matrix of 2 rows by 1 column; Aout representing output signals from the synapse layer 120 may be expressed as a matrix of 3 rows by 1 column; W representing the weights of the synapse layer 120 may be expressed as a matrix of 3 rows by 2 columns, having six weight values; and Bias representing bias values added to the neuron layer 130 may be expressed as a 3 rows by 1 column matrix. A non-linear function f applied to each element of (W×Ain+Bias) in equation (1) may determine the final values of each element of Aout. By way of another example, the neuron array layer 110 may receive input signals from sensors and the neuron array layer 190 may represent response signals.

In embodiments, there may be numerous neurons and synapses in the neural network 100, and matrix multiplication and summation in equation (1) may be a process that may consume a large amount of computing resources. In conventional processing-in-memory computing approaches, a computing device performs the matrix multiplication within an NVM cell array using analog electrical values rather than using the digital logic and arithmetic components. These conventional designs aim to reduce the computational load and reduce power requirements by reducing the communication between CMOS logic and NVM components. These conventional approaches, however, are prone to have large variations on current input signals to each synapse because of large parasitic resistance on the current input signal path in a large scale NVM cell array. Also, sneak currents through half-selected cells in a large array change the programmed resistance values, resulting in unwanted program disturbance and degradation of neural network computation accuracy.

Unlike the conventional approaches, in embodiments, a power efficient neural network may be based on logic friendly non-volatile synapses with a differential architecture, where the differential architecture may include a select transistor and a logic friendly NVM. In embodiments, a fully differential synapse architecture may widen the operational range of the synapse circuit as a multiplier. Compared to conventional architectures, in embodiments, the slight multiplication error may be beneficial for compensating certain levels of quantization noise of the trained weight parameters.

As discussed below in detail, in embodiments, input signal to each synapse in the synapse layers 120, 140, 160, and 180 may be directed to the gate terminal of the select transistor of the synapse, suppressing multiplication noise. In embodiments, the multiplier current may be approximately the gate terminal voltage times the resistance level of variable resistor or NVM.

Figure 2:
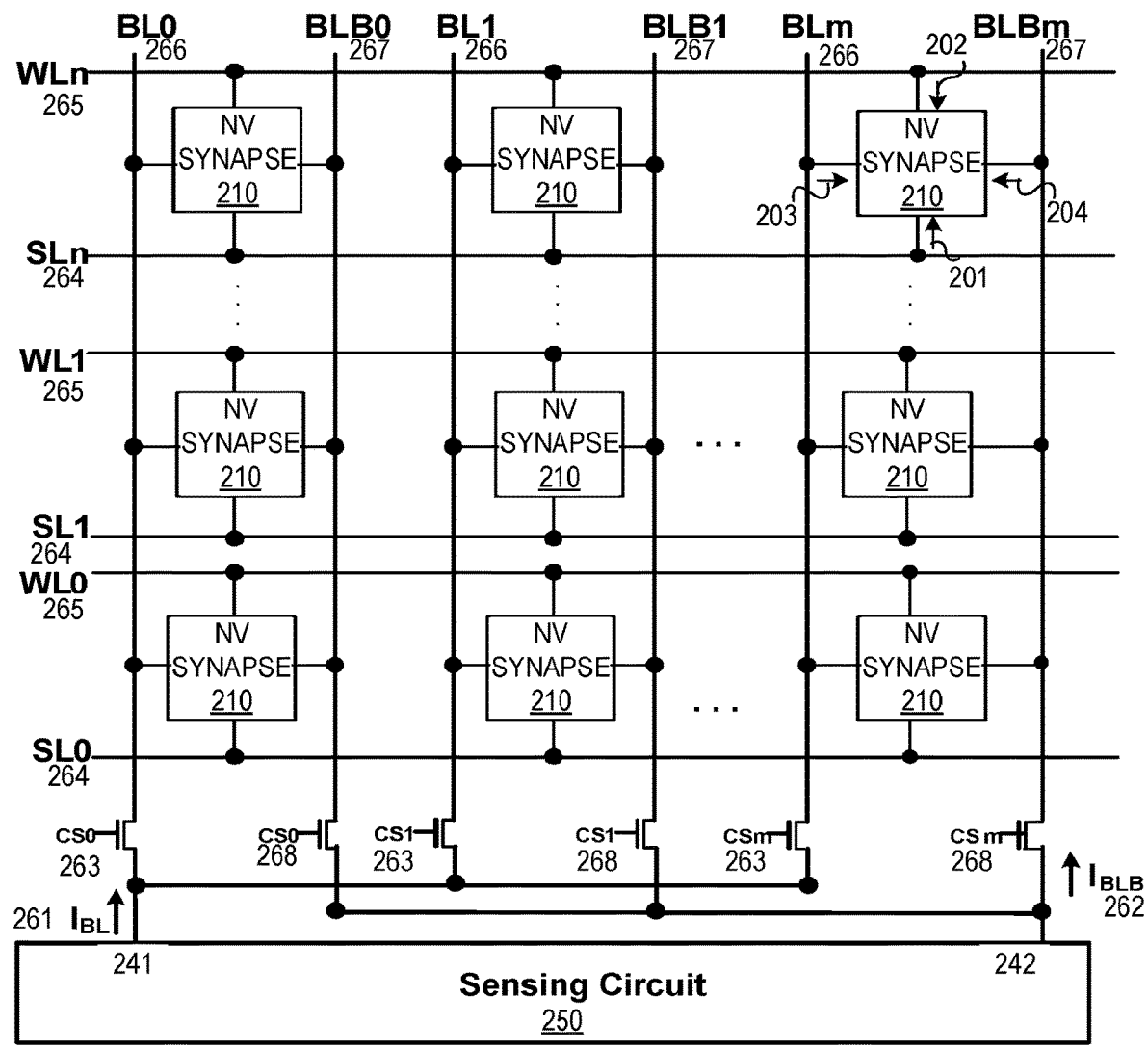
FIG. 2 shows a schematic diagram of an array of synapses according to embodiments of the present disclosure.

FIG. 2 shows a schematic diagram of an array of synapses 200 according to embodiments of the present disclosure. As depicted, the array of synapses 200 may include: non-volatile synapses 210 arranged into rows and columns; positive output current lines (Bit Lines) 266 that are electrically coupled to column selection transistors 263, respectively; negative output current lines (Bit Line Bar lines) 267 that are electrically coupled to column selection transistors 268, respectively. In embodiments, the drain terminals of the column selection transistors 263 may be electrically coupled to the positive current port 241 of sensing circuit 250, and the drain terminals of the column selection transistors 268 may be electrically coupled to the negative current port 242 of the sensing circuit 250.

In embodiments, each non-volatile synapse 210 may store one positive weight value and one negative weight value. In embodiments, each non-volatile synapse 210 may be electrically coupled to: a signal line (or, equivalently reference signal line) (e.g., SL1) 264 to receive a reference voltage input 201; a word line (or, equivalently, input signal line) (e.g., WL1) 265 to receive a signal voltage input 202; a positive output line (e.g., BL1) 266 to output a positive current output 203; and a negative output line (e.g., BLB1) 267 to output a negative current output 204.

In embodiments, each of the signal voltage input 202 and reference voltage input 201 may be associated with both the positive and the negative weight values, respectively, and the positive current output 203 may be associated with the positive weight value, and the negative current output 204 may be associated with the negative weight value.

In embodiments, the positive (or negative) weight value that is stored in each non-volatile synapse 210 may be represented as a reciprocal of variable resistance value, and the signal voltage input 202 and the reference voltage input values 201 may be electrical voltage values. In embodiments, the value of the positive current output 203 may be the result of a multiplication of the positive weight value times the signal voltage input 202, and the value of the negative current output 204 may be the result of a multiplication of the negative weight value times the signal voltage input 202.

As depicted in FIG. 2, each row of the non-volatile synapses array 200 may share a reference voltage line, SL, 264 and a signal voltage line, WL, 265, where each SL may provide reference voltage inputs 201 to the non-volatile synapses in the corresponding row, and each WL may provide signal voltage inputs 202 to the non-volatile synapses in the corresponding row, such that the non-volatile synapses in a row may receive substantially the same signal voltage input and the same reference voltage input.

As discussed above, each column of the non-volatile synapses array 200 may share a positive output current line (BL) 266 and a negative output current line (BL-Bar) 267, i.e., each positive current output 203 of the synapses of the column may be collected by a corresponding BL 266 and each negative current output 204 of the synapses of the column may be collected by a corresponding BL-bar lines 267. As such, the electrical current on the BL line 266 may be the summation of the positive electrical output currents 203 from the synapses of the column. Similarly, in embodiments, the electrical current value on the BL-bar lines 267 may be the summation of the negative electrical output currents 204 from the synapses of the column.

In embodiments, each positive output current line (BL) 266 may be electrically coupled to the source terminal of a corresponding column selection transistor 263, and each negative output current line (BL-Bar) 267 may be electrically coupled to the source terminal of a corresponding column selection transistor 268. In embodiments, the column selection transistors of a pair of BL and BL-Bar lines 263 and 268 may receive the same column selection signal at the gate terminals from an external column selection circuit (not shown in FIG. 2). In embodiments, the lines from the drain terminals of the column selection transistors 263 may be electrically coupled to the positive current input 241 of the sensing circuit 250. In embodiments, the lines from the drain terminals of the column selection transistors 268 may be electrically coupled to the negative current input 242.

In embodiments, the electrical current value (IBL) 261 of the positive current port 241 may be the value on the positive output current BL 266 that receives a column selection signal on its respective column selection transistor 263. Likewise, the electrical current value (IBL-bar) 262 of the negative current input 242 may be the negative output current line BL-Bar 267 that receives a column selection signal on its respective column selection transistor 268.

In embodiments, one or more of the rows of the synapses 210 may have a fixed input signal voltage on the WLs 265 and the synapses on such rows may store bias values for their columns. In embodiments, the array of synapses may implement the matrix multiplication in equation (1)

$$W \times Ain + \text{Bias}$$

where, W may be the synapse array, and Ain the matrix representing the WL inputs.

In embodiments, each non-volatile synapse 210 may have two circuits (or equivalently cells) that store negative and positive weights. In embodiments, as discussed above, the weight values may be represented by the reciprocal value of a variable resistance, $1/R_n = W\_neg$, and $1/R_p = W\_pos$, respectively. Each row of synapses in the array 200 may receive an input signal as an electrical voltage, Ain. In response to the input signal, each synapse in the array 200 may produce a positive output current through BL (e.g., BL0 266) and a negative output current through BLB (e.g., 267), where the value of the positive output current BLc may be expressed as: $BLc = Ain \times W\_pos$ and the negative output current BLBc may be expressed as: $BLBc = Ain \times W\_neg$.

In embodiments, the weight values, W, for each synapse layer of the neural network 100 may be determined (calculated and adjusted) in a separate training phase. Then, input signals, Ain, may be applied to the neural network 100 during the inference phase, where the pre-determined weights may be used to produce output values. In embodiments, the weight values that may be determined during the training phase may not change during the inference stage.

In embodiments, as discussed above, a BL (e.g., $BL_1$) may be electrically coupled to all of the output lines of the synapses in a column of the synapse array 200, and the BL-bar line (e.g., $BLB_1$) may be electrically coupled to all of the output lines of the synapses of the synapse array 200. Such configuration may make the current value on each BL 266 (or BLB 267) be the summation of the individually calculated current values of the corresponding column of synapses in the array 200. In embodiments, the output current on a line, BLn, and a line, BLBn, may be expressed as:

$$BLn = \sum (\text{W\_pos-row} \times \text{Ain-row}), \text{ for the rows of column-}n \quad (2a)$$

$$BLBn = \sum (\text{W\_neg-row} \times \text{Ain-row}), \text{ for the rows of column-}n \quad (2b)$$

In embodiments, one or more of the rows of the array 200 may have a fixed input signal voltage and the synapses on such rows may store bias values for their columns. In such a case, the total electric current on BLn and BLBn may be expressed as:

$$BLn = \sum (\text{W\_pos-row} \times \text{Ain-row}) + \text{bias\_pos} \quad (3a)$$

$$BLBn = \sum (\text{W\_neg-row} \times \text{Ain-row}) + \text{bias\_neg} \quad (3b)$$

In embodiments, in the sensing circuit 250, the current input signal ($I_{sig}$=IBL 261 or IBLB 262) from the synapse array may be converted to a voltage signal ($V_{sig}$) using a Capacitive Trans Impedance Amplifier (CTIA) and further processed to produce a digital signal using an Analog Digital Converter (ADC). In embodiments, the ADC may have a single-slope column ADC architecture using an offset canceling column comparator and a counter. Such design may use minimal area and power dissipation compared to other ADC architectures, such as pipelined or successive approximation ADCs.

In embodiments, each synapse layer (e.g., 120) in the neural network 100 may have electrical components (not shown in FIG. 2) that may be electrically coupled to BL 266 and BLB 267 and electrically process the output currents on the BL and BLB lines. For instance, the electrical components may provide differential sensing, convert the output current signals to voltage signals, further convert to digital signals and summate the digital signals in an accumulator. In another example, the electrical components may perform other various processing operations, such as normalization and activation, to the accumulated value, to thereby implement the activation function for Aout of equation (1). In embodiments, the final Aout may be stored in a data buffer and used to generate the input signals for the next neural array layer in the neural network 100.

It is noted that, in embodiments, separate circuits (not shown in FIG. 2) may be included in the neural network 100 to perform auxiliary functions such as: (1) a router/controller that maps the logical neuron-synapse structure of the neural network 100 to the physical address mapping of the synapse array 200, (2) a driving circuit that drives the input signals to the appropriate rows of synapses of a configuration, (3) a selection circuit that provides column selection for the sensing circuits that are shared by more than one column of synapses, (4) a voltage generator that generates reference voltages used to select synapses, and (5) a storage that stores the configurations for the router controller and sensing circuits 250.

Figure 3:
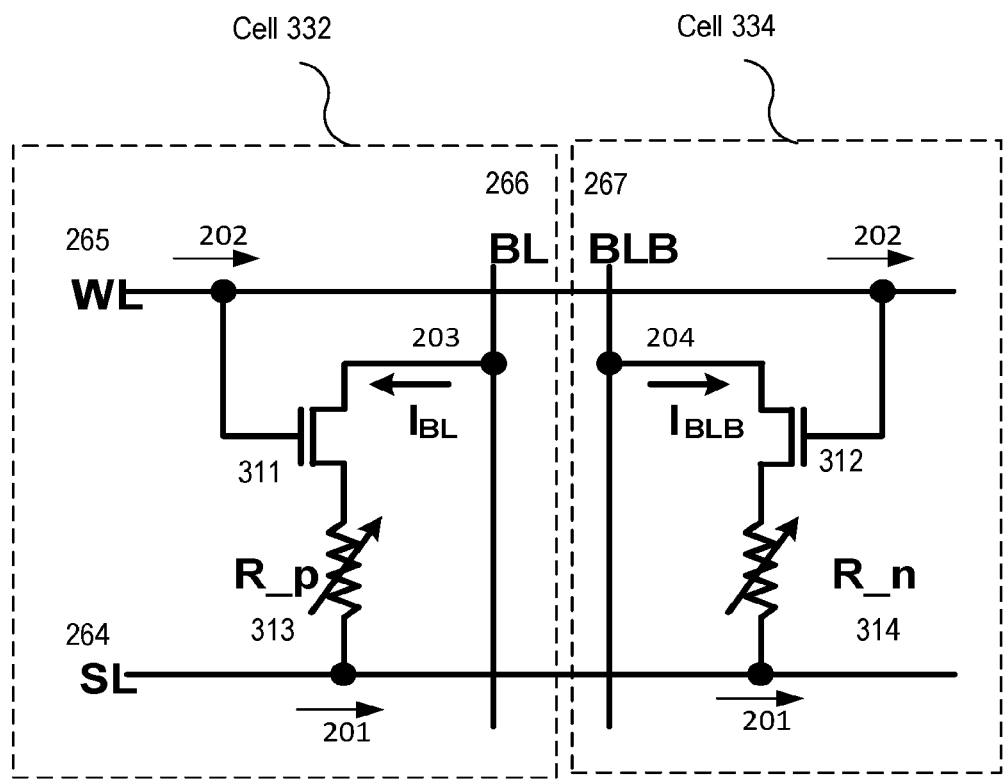
FIG. 3 shows a schematic diagram of a synapse according to embodiments of the present disclosure.

FIG. 3 shows a schematic diagram of a synapse 300 according to embodiments of the present disclosure. In embodiments, the synapse 300 may be used as the synapse 210 in FIG. 2. As depicted, the synapse 300 may include: a pair of input transistors 311 and 312; and a pair of non-volatile resistive changing elements, R_p 313 and R_n 314 (hereinafter, the term "non-volatile resistive changing element" and "resistor" are used interchangeably). Stated differently, the synapse 300 may have a pair of 1T-1R (one-transistor one-resistor) structure. In embodiments, the resistors R_p 313 and R_n 314 may be logic friendly non-volatile resistive changing elements. In embodiments, the synapse 300 may be considered to have two cells 332 and 334, where each cell may have one input transistor 311 (or 312) and a resistor R_p 312 (or R_n 314).

In embodiments, the logic friendly non-volatile resistive changing element, R_p 313 (or R_n 314) may be associated with the positive (or negative) weight parameter that the synapse 300 may remember/store. In embodiments, each resistor may be electrically coupled to the source terminal of the input transistor (e.g., 311) and the reference signal line 264 may apply a reference signal to the resistor. In embodiments, the word line (WL) 265 may apply an input signal voltage to the gate terminal of the input transistor (e.g., 311).

In embodiments, the resistance value R (=R_p or R_n) may be programmed into the resistive changing element in a training phase. When the synapse input signal is applied on WL 265, the synapse output current may approximate the multiplication of the weight (represented by 1/R) by input value Ain from the previous neuron, where Ain may be represented by a voltage on WL 265.

In embodiments, the neural network parameters that are stored in the synapse array 200 may have about similar number of positive and negative weight parameters. Unused resistive elements in the array 200 may be programmed to have a resistance value higher than a preset value. The electrical current through each unused resistive element should substantially be zero, so that the output current of the cell substantially does not add to the output current on the BL (or BLB) of the cell. Therefore, the effect of the unused resistive elements on the computation is minimized, and power consumption is reduced. Trained weight parameters may be quantized and programmed into the resistive changing elements without much accuracy degradation of neural network computation. When the resistance value, R, of the resistor R_p 313 (or R_n 314) is programmed in the training phase and a scaled synapse input signal WLs is applied through WL 265, the synapse output current, IC, on BL 266 (or BLB 267) may be described by equations (4) and (5):

$$dIC/dWL = \sim gm/(1 + gm*R) = \sim \quad (4)$$

$$1/R \text{ (when } R \text{ is greater enough than } 1/gm)$$

where, gm is the conductance of the input transistor, and $$IC = \sim WL/R = \sim w \text{ Ain (where } w = 1/R, \text{ Ain} = WL) \quad (5)$$

where w and Ain may produce their multiplication result IC approximately.

As indicated in equation (5), the output current IC may approximate the multiplication of the input signal (input voltage Ain) times the weight (w). Unlike the conventional systems, this analog multiplication operation of equation (5), which occurs in the synapse 300, does not require the use of complex digital logic gates, significantly reducing the complexity of synapse structure and usage of computational resources.

In embodiments, the input signal Ain may be an output signal from a previous neuron (as shown in FIG. 1) and driven to the gate of the input transistor 311 (or 312). Driving the input signal Ain to the gate may minimize the noise generated by parasitic resistance in a large array of synapse since there is no static on-current into the gate of the select transistor. In contrast, in conventional systems, input signals are driven to the selector or resistive changing element of the synapse, which is prone to have large variations on current input signals to each synapse because of large parasitic resistance in a large array and static current flow during operation.

In conventional systems, when programming resistive changing elements, sneak currents through half-selected cells in a large array can change previously programmed resistance values, resulting in unwanted program disturbances. In contrast, in embodiments, the input transistor 311 (or 312) may be enabled for a program pulse to be driven only to the selected resistor 313 (or 314) in a large array. Therefore, in embodiments, unselected synapses may not disturb the programming of selected synapses, where selected synapses may be programmed by applying suitable bias conditions to the BL (or BLB) and SL nodes.

By way of an example and not limitation, the array of synapse 200 may be located in a synapse layer 120, where the output signals from a previous neuron (e.g., 112*a*) in the neuron array layer 110 may be input to a synapse 300 of the synapse array 200 and the output signals from BL 266 and BLB 267 of the synapse 300 may be input to one or more of the next neurons (e.g., 132*a*-132*m*) in the neuron array layer 130.

In embodiments, the resistor 313 (or 314) may be implemented with various circuits (or memories), such as non-volatile MRAM, RRAM, or PRAM or single-poly embedded flash memory, where the circuit may be programmed to remember (store) an associate parameter that may be represented by a reciprocal of resistance. It is noted that, in embodiments, the multiplication operation may be completed within the synapse with analog values, without the use of digital logic and arithmetic circuits.

Figure 4:
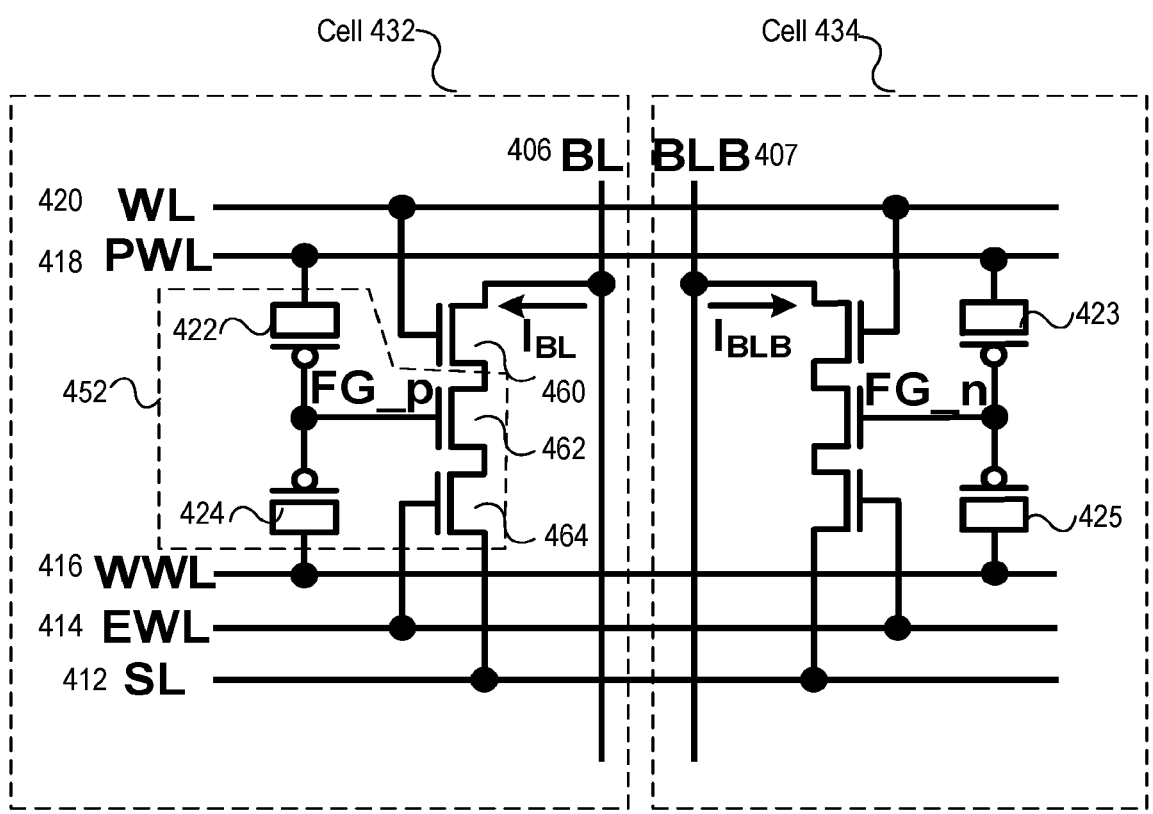
FIG. 4 shows a schematic diagram of another synapse according to embodiments of the present disclosure.

FIG. 4 shows a schematic diagram of another synapse 400 according to embodiments of the present disclosure. In embodiments, the synapse 400 may show an exemplary implementation of the resistors 313 and 314 in FIG. 3. Stated differently, in embodiments, the resistor 313 may be implemented by the components in the box 452 in FIG. 4.

As depicted in FIG. 4, the synapse 400 includes a pair of a logic compatible embedded flash memory cells 432 and 434, where the floating gate nodes, FG_p and FG_n, in the flash memory cells may be associated with the positive and negative weight parameters respectively that this synapse 400 remembers/stores.

In embodiments, the synapse input signal on WL 420 may be shared between the two branches that may draw differential synapse output currents (IBL and IBLB) on BL 406 and BLB 407. In embodiments, the program word line (or, shortly program line, PWL) 418, write word line (or, shortly write line, WWL) 416, and erase word line (or, shortly erase line, EWL) 414 may be used to provide additional control signals for program, write and erase operations of the logic compatible embedded flash memory cells 432 and 434.

In embodiments, the memory cells 432 and 434 may include logic transistors, obviating any additional process overhead beyond standard logic process. In embodiments, the coupling transistor 422 (and 423) directly connected to PWL 418 may be upsized for higher coupling of the floating gate nodes (FG_p and FG_n) to the control signal provided through PWL 418. In embodiments, the coupling transistor 422 (or 423) directly coupled to PWL 418 may be relatively larger than the write transistor 424 (or 425). With high program voltages driven to PWL 418 and WWL 416, the memory cell 432 (or 434) may be selected and programmed by injecting electrons into FG_p while applying 0 volt to BL 406 (or BLB 407), whereas the unselected cell 434 (or 432) may be program-inhibited by applying VDD to BLB 407 (or BL 406) and applying VDD to WL 420 to thereby turn off the select transistor of the unselected cell 434 (or 432). Hereinafter, the term select transistor refers to a transistor having a gate that is electrically coupled to the BL 406 or BLB 407.

In embodiments, with high erase voltage driven only to WWL 416, the selected WL may be erased by ejecting electrons from FG. Unselected WLs may not be driven to any higher voltage than VDD during program and erase operation; therefore, there is no disturbance in the unselected WLs. In embodiments, FG node voltage may be a function of signals on PWL 418, WWL 416 and stored number of electrons in the FG node. Conductance of the read transistors (e.g., 462) electrically coupled to the FG may be programmable by controlling voltages at PWL 418 and WWL 416 and the electrical charge stored at the FG node.

In embodiments, when the threshold voltage of the embedded flash cell 432 (or 434) is programmed, and when a scaled synapse input signal is provided through WL 420, there may be a certain range of the threshold voltage such that the equation (5) may be approximately met where cell output currents (=IBL and IBLB) are proportional to the programmed weight parameter as well as the input signal.

In embodiments, neural network 100 may be robust to the random errors or small variation of weight parameters. In embodiments, when the pre-trained weight parameters, W, are quantized during computation of the neural network 100, neural network performance or inference accuracy may be optimized with the slight multiplication error from equation (5) as long as the multiplication error is within a certain range. Furthermore, the slight multiplication error from the proposed approximate multiplier may compensate quantization noise of the trained weight parameters of the neural network 100. Nevertheless, to avoid severe cell retention error caused by large cell threshold voltage shift after repetitive training of the neural network, an intentional self-healing current may be applied through WWL 416, as the intentional self-healing current may cure the damaged gate oxide of the device electrically coupled to WWL 416 of embedded flash memory cells 432 and 434. In embodiments, applying the self-healing current may not be required with every training or inference, and therefore has minimal effect on performance or power consumption.

In embodiments, each cell (e.g., 432) may include coupling transistor 422, write transistor 424 and upper (or first) select transistor 460, read transistor 462, and lower select transistor 464. It is noted that the single-poly embedded flash memory in the synapse 400 may be used as the resistive changing element, and the conductance of the read transistors (e.g., 462) that are electrically coupled to the floating gate (FG) of the flash, may serve as the resistive changing element. In embodiments, the conductance of the read transistors (e.g., 462) may be determined by the threshold voltage VTH of their respective FG nodes, FG_p or FG_n. The VTH of the FG nodes FG_p or FG_n may be first coarsely programmed using a balanced step pulse programming method, then subsequent constant pulse programming steps with reduced voltages can fine tune the VTH value to accurately program the weight value to be stored in the synapse 400. The programming steps are described in conjunction with FIGS. 10A-10B.

Figure 5:
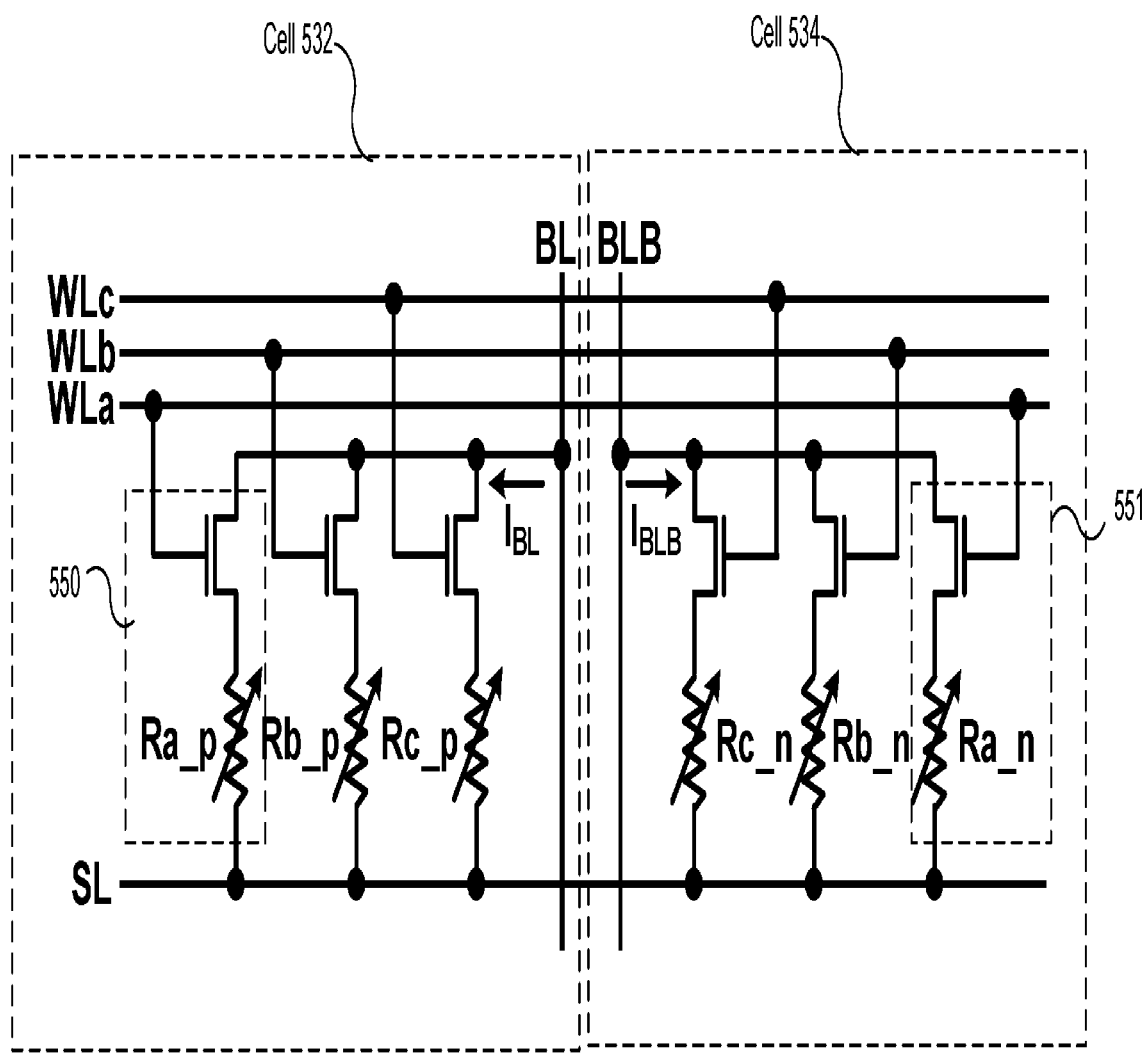
FIG. 5 shows a schematic diagram of another synapse according to embodiments of the present disclosure.

FIG. 5 shows a schematic diagram of a synapse 500 according to embodiments of the present disclosure. In embodiments, the synapse 500 may be used as the synapse 210 in FIG. 2. As depicted, the synapse 500 may have three pairs of IT-IRs, where the three word lines, WLa, WLb, and WLc, may be electrically coupled to the gates of the six transistors. It is noted that the synapse 500 may have other suitable number of input transistors and resistors as well as word lines that are electrically coupled to the input transistors. For instance, in embodiments, the synapse 500 may be modified so that the word line WLa and the components in the 1T-1R units 550 and 551 may be deleted, i.e., each cell may have two pairs of 1T-1Rs. In another example, in embodiments, the synapse 500 may be modifies so that each cell may have four pairs of 1T-1Rs and four word lines (input signal lines) WLs.

In embodiments, the SL, BL and BLB of the synapse 500 may have similar functions as the SL, BL and BLB in the synapse 300 of the synapse 300. The difference between the synapse 300 and synapse 500 is that the synapse 500 may receive input signals from the previous neuron through the three word lines, WLa, WLb and WLc. More specifically, the signal from each WL may be driven to a gate terminal of a corresponding input transistor.

It is noted that each synapse 500 may be electrically coupled to three word lines WLa, WLb and WLc, while each synapse 210 in FIG. 2 is shown to be coupled to one word line 265. Thus, it is noted that each word line 265 in FIG. 2 collectively refers to one or more word lines that are electrically coupled to a synapse that includes one or more input transistors.

In embodiment, the synapse 500 may be considered to have two cells 532 and 534, where each cell may have three pairs of 1T-1R (one transistor-one resistor and each 1T-1R pair may be electrically coupled to WL and SL.

It is noted that each resistor in the synapse 500 may be implemented by various circuits (or memories), such as non-volatile MRAM, RRAM, or PRAM or single-poly embedded flash memory, where the circuit may be programmed to remember (store) an associated parameter that may be represented by a resistance. In embodiments, each resistor in the synapse 500 may be implemented by the components in the box 452 in FIG. 4, where each synapse 500 may be electrically connected to PWL, WWL and EWL in the manner similar to the synapse 400.

Figure 6:
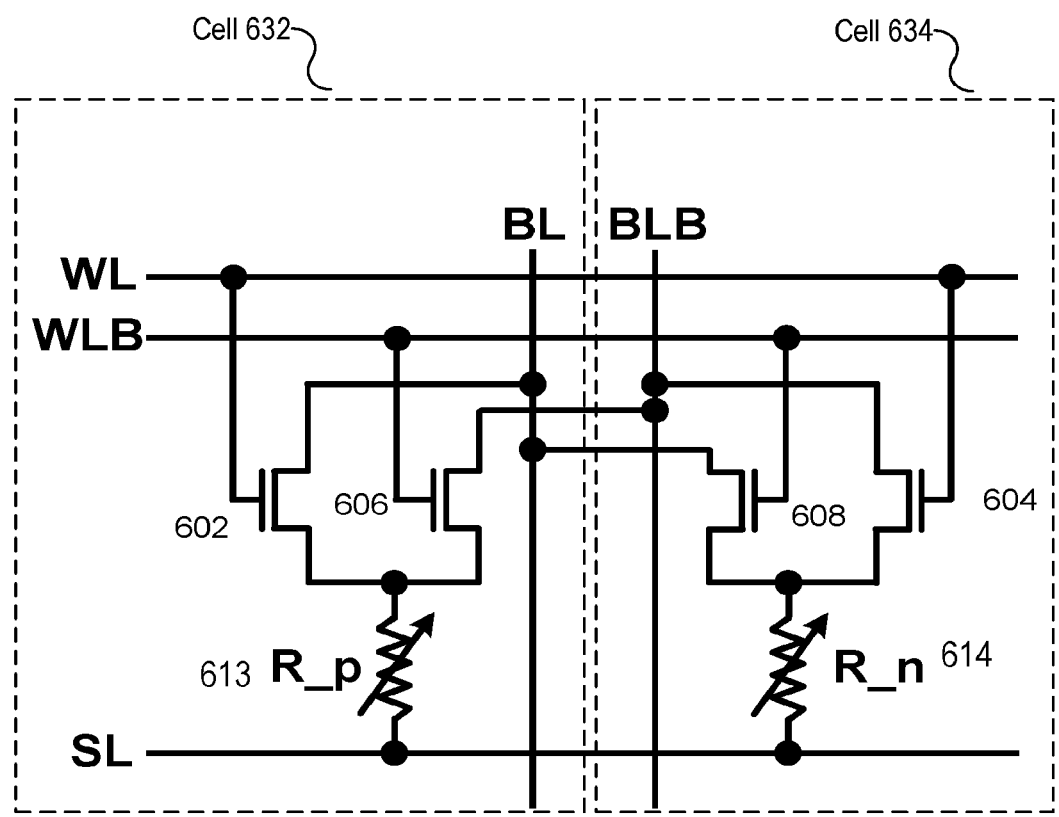
FIG. 6 shows a schematic diagram of another synapse according to embodiments of the present disclosure.

FIG. 6 shows a schematic diagram of another synapse 600 according to embodiments of the present disclosure. In embodiments, the synapse 600 may be used as the synapse 210 in FIG. 2. As depicted, each of the cells 632 and 634 may include two transistors (e.g., 602 and 606) and one resistor (e.g., 613) and electrically coupled to two input signal (or word) lines, word line (WL) and word line bar (WLB), and one reference signal line, SL. It is noted that each synapse 600 may be electrically coupled to the two word lines, while each synapse 210 in FIG. 2 is shown to be coupled to one word line 265. Thus, as discussed above, each word line 265 in FIG. 2 collectively refers to one or more word lines that are electrically coupled to a synapse that includes one or more input transistors.

In embodiments, the synapse resistors R_p 613 and R_n 614, the reference signal line SL, output current lines BL and BLB may have similar functions as the corresponding components of the synapse 230 in FIG. 3. For instance, the input selection transistors 602 and 604, which are electrically coupled to WL and the respective resistors R_p 613 and R_n 614, may correspond to input selection transistors 211 and 212 respectively.

Compared with the synapse 300 in FIG. 3, the synapse 600 may be electrically coupled to another input signal line, WLB, where WLB may provide a differential input signal voltage relative to WL. In embodiments, additional input selection transistors 606 and 608 may be electrically coupled to WLB through their gate terminals. In embodiments, the source terminals of input selection transistors 606 and 608 may be electrically coupled to the resistors R_p 613 and R_n 614 respectively. In embodiments, the drain terminal of the transistor 602 may be electrically coupled to BL and the drain terminal of the transistor 606 may be electrically coupled to BLB. Likewise, the drain terminals of the transistor 604 may be electrically coupled to BLB and the drain terminal of the transistor 608 may be electrically coupled to BL.

In embodiments, the synapse 600 may receive differential input signals, where WL provides a positive input signal voltage (to the common mode reference), a_pos, and WLB provides a negative input signal voltage (to the common mode reference), a_neg. In embodiments, R_p 613 may store a positive weight w_pos and R_n 614 may store a negative weight w_neg. Thus, in embodiments, the output signal currents (BLo) on BL may be the sum of two output signals from the two cells 532 and 534:

$$BLo = a\_pos \times w\_pos + a\_neg \times w\_neg \qquad (6)$$

Likewise, the output signal current (BLBo) on BLB may be the sum of two output signals from the two cells 532 and 534:

$$BLBo = a\_pos \times w\_neg + a\_neg \times w\_pos. \qquad (7)$$

Thus, some embodiments with differential signaling on WL and WLB as depicted, may have a greater range of output currents on BL and BLB compared to the other embodiments with single-ended signaling on the WL of synapse 300 depicted in FIG. 3. In addition, embodiments with differential input signaling as depicted may suppress transistor offset noise as well as common mode noise from variations in supply voltage or temperature.

Figure 7:
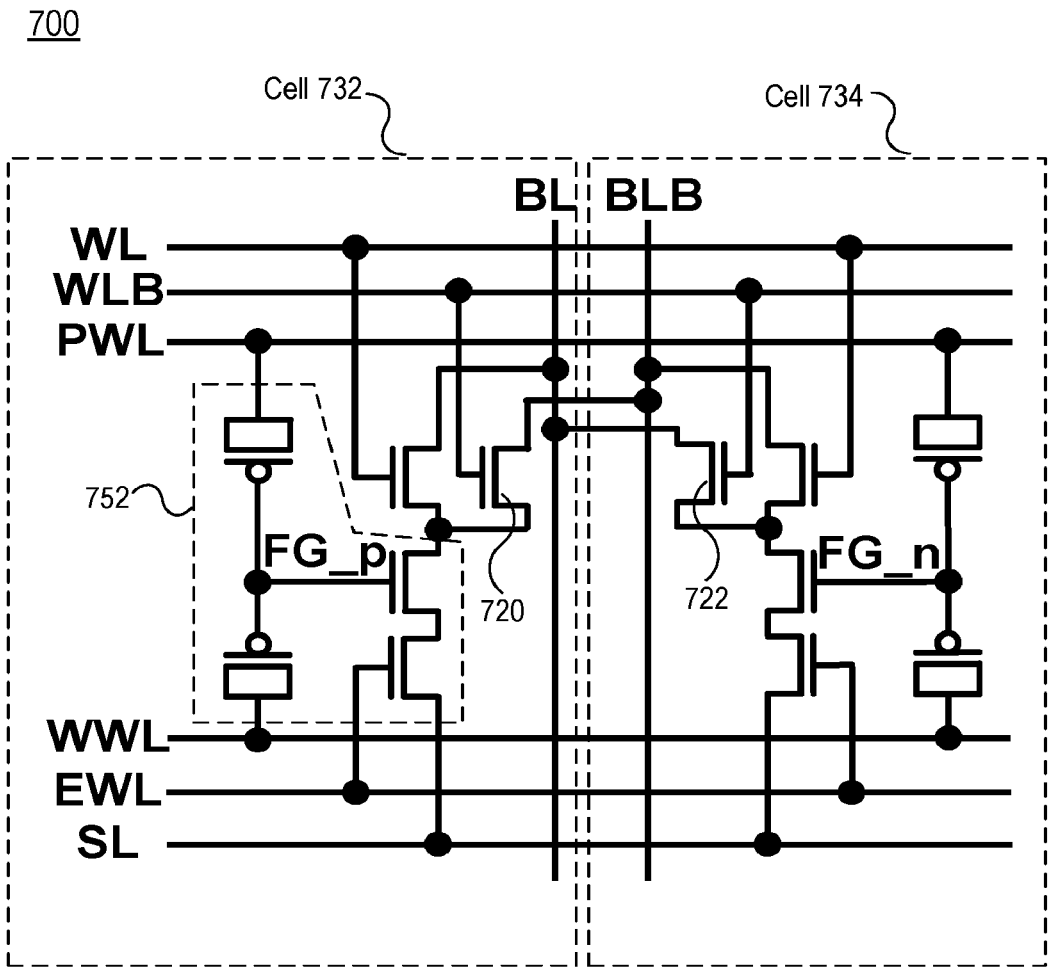
FIG. 7 shows a schematic diagram of another synapse according to embodiments of the present disclosure.

It is noted that each resistor in the synapse 600 may be implemented by various circuits (or memories), such as non-volatile MRAM, RRAM, or PRAM or single-poly embedded flash memory, where the circuit may be programmed to remember (store) an associated parameter. FIG. 7 shows a schematic diagram of another synapse 700 according to embodiments of the present disclosure. In embodiments, the synapse 700 may show an exemplary implementation of the resistors 613 and 614 in FIG. 6. Stated differently, the components in the box 752 may correspond to the resistor 613 in FIG. 6.

As depicted in FIG. 7, the synapse 700 may include two cells 732 and 734. In embodiments, the cell 732 (or 734) may be similar to the cell 432 (or 434) of the synapse 400, with the difference that the cell 732 (or 734) may include an additional upper select transistor 720 (or 722) and an additional input signal line WLB. In embodiments, the gate of the transistor 720 (or 722) may be electrically coupled to the input signal line WLB and the drain of the transistor 720 (or 722) may be electrically coupled to the output signal line BLB.

Figure 8:
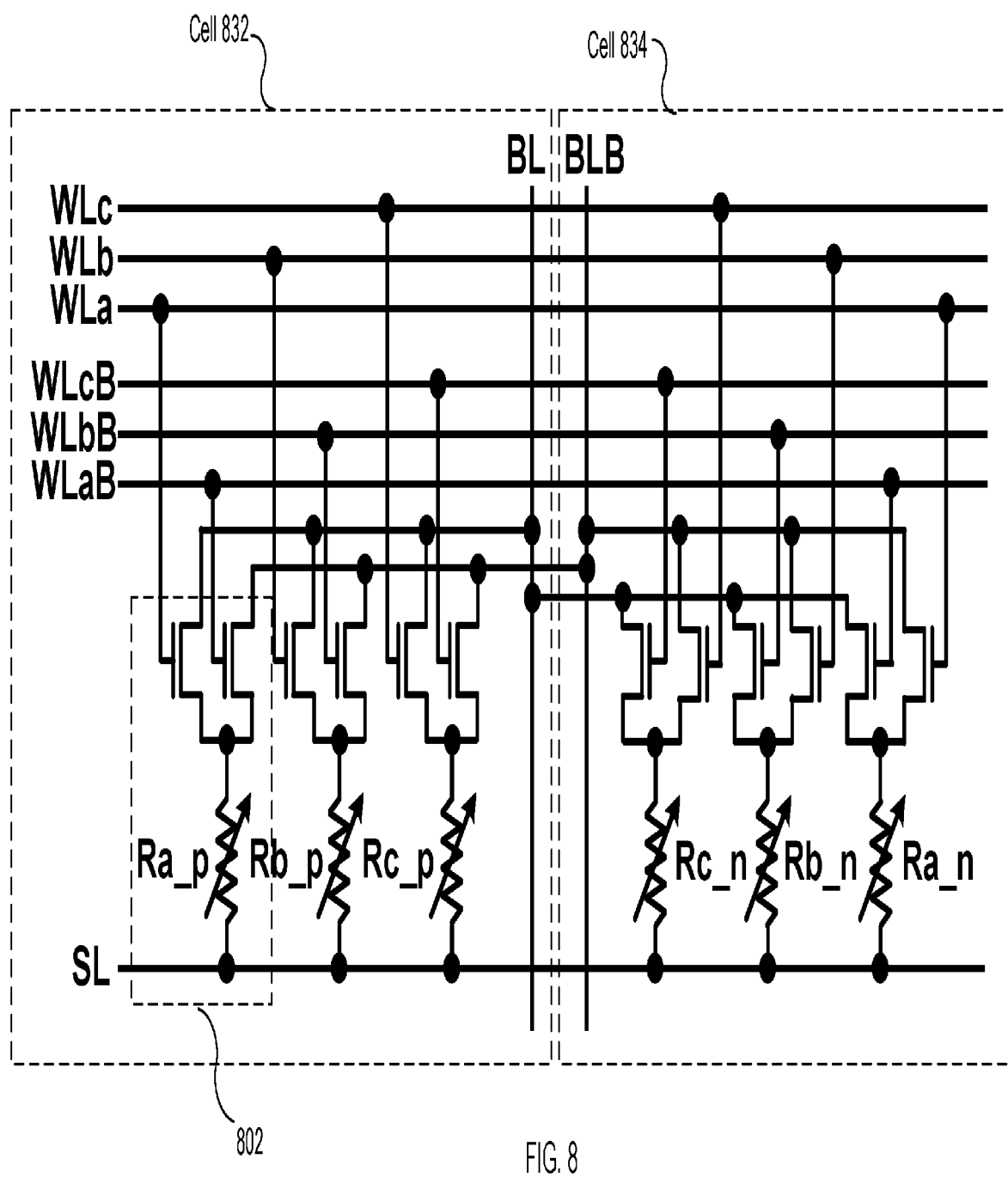
FIG. 8 shows a schematic diagram of another synapse according to embodiments of the present disclosure.

FIG. 8 shows a schematic diagram of another synapse 800 according to embodiments of the present disclosure. In embodiments, the synapse 800 may be used as the synapse 210 in FIG. 2. As depicted, the synapse 800 may include two cells 832 and 834, where each cell may include three resistors and six transistors. The synapse 800 may have the 2T-1R structure, i.e., each cell may include three sets of 2T-1R unit 802. The synapse 800 may be electrically coupled to six input signal lines: three word lines, WLa, WLb, and WLc; and three word Line Bars, WLaB, WLbB, and WLcB. It is noted that each cell of the synapse 800 may include other suitable number of 2T-1R units 802. In embodiments, each pair of WL and WLB (e.g., WLa and WLaB) may provide differential input signals to the cells 832 and 834.

In embodiments, the reference signal lines, SL, may provide a reference signal to the cells 832 and 834. In embodiments, each of the output signal lines, BL and BLB, may collect the output signals from the drain terminals of three transistors in the cell 832 and the drain terminals of three transistors in the cell 834. In embodiments, the synapse 800 may receive differential input signals, where each WLi provides a positive input signal voltage, a_pos_i, and each WLBj provides a negative input signal voltage, a_neg_j. In embodiments, each R_p may store a positive weight w_pos_i and each R_n may store a negative weight w_neg_j. In embodiments, the output signal currents (BLo) on BL may be the sum of six output signals from the two cells 832 and 834:

$$BLo = \sum(a\_pos\_i \times w\_neg\_i) + \sum(a\_neg\_j \times w\_pos\_i) \quad (8)$$

Likewise, the output signal current (BLBo) on BLB may be the sum of six output signals from the two cells 832 and 834:

$$BLBo = \sum(a\_pos\_i \times w\_neg\_j + \sum(a\_neg\_j \times w\_pos\_i). \quad (9)$$

It is noted that each resistor in the synapse 800 may be implemented by various circuits (or memories), such as non-volatile MRAM, RRAM, or PRAM or single-poly embedded flash memory, where the circuit may be programmed to remember (store) an associated parameter. In embodiments, each resistor in the synapse 800 may be implemented by the components in the box 752 in FIG. 7, where each synapse 800 may be electrically connected to PWL, WWL and EWL in the manner similar to the synapse 700.

Figures 9A, 9B:
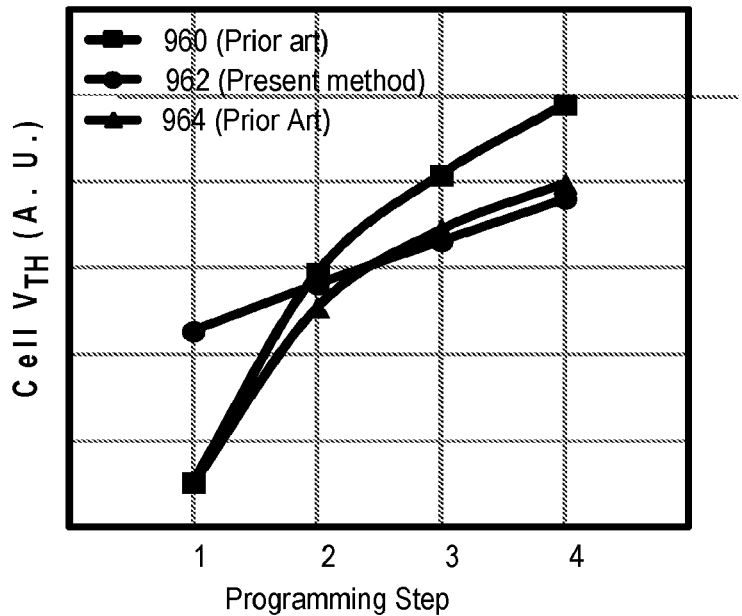
FIG. 9A-9B show comparison of conventional methods for programming the threshold voltage (VTH) to a method according to embodiments of the present disclosure.

In general, the conductance of a read transistor (e.g., 462) may be changed by injecting electrons into the floating gate. FIG. 9A-9B show a comparison of two conventional methods for programming the threshold voltage (VTH) of a floating gate node (column 910 and 914) to the method according to the embodiments (column 912). FIG. 9A shows a table 900 that includes the voltage heights and widths of signals applied to the terminals PWL and WWL during program operation of the floating gate cell (432), thus injecting electrons into the floating gate. As depicted, the table 900 includes three columns 910, 912 and 914 that correspond to three approaches for applying voltage signals, respectively.

The column 910 shows a conventional incremental step pulse programming method where each subsequent program pulse step increases program voltage from the previous step by an amount delta with a constant pulse width (T_pulse). The column 912 shows a balanced step pulse programming method according to the embodiments where the first step has a longer programming pulse width by certain design parameter (m) compared to the programming method in column 910. The column 914 shows a conventional constant pulse programming method where every step has the same program voltage and program pulse width.

FIG. 9B shows the plots of VTH 950 of the floating gate cell (432 or 434) according to the three methods in FIG. 9A. In FIG. 9B, the three plots 960, 962, and 964 correspond to the three methods 910, 912, and 914, respectively, and each plot in FIG. 9B shows the VTH of the floating gate cell (432 or 434) after each step of the corresponding method in FIG. 9A.

Based on the plots 950, the balanced step pulse programming method according to embodiments of the present disclosure may be preferred among these three methods. Each step increases the VTH by approximately the same amount, delta, thus the VTH may be programmed accurately, resulting in a narrower VTH variation than the other methods.

Figures 10A, 10B:
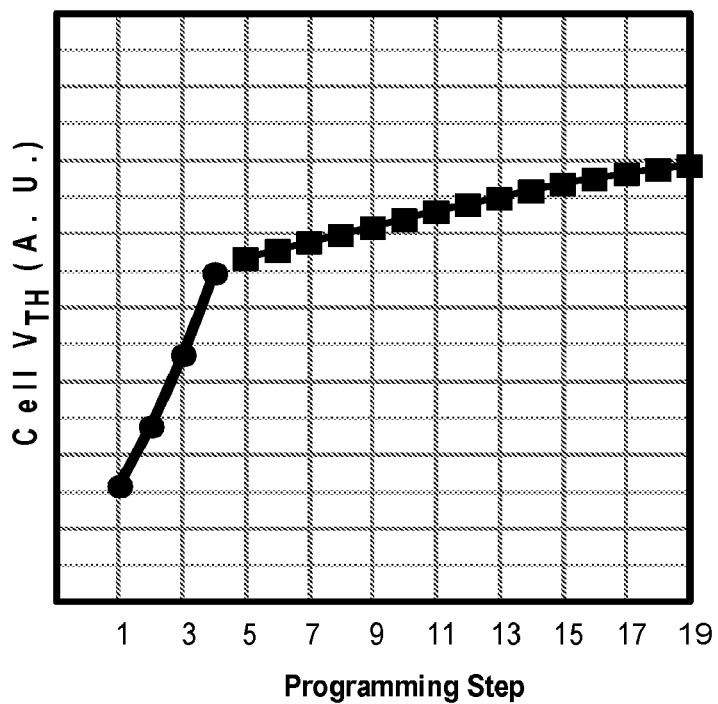
FIG. 10A-10B show another method for programming a threshold voltage (VTH) of a floating gate node according to embodiments of the present disclosure.

FIG. 10A-10B show another method for programming the threshold voltage (VTH) of a floating gate cell (432 or 434) according to embodiments of the present disclosure. FIG. 10A shows a table 1000 that includes the voltage heights and widths of signals applied to the terminals PWL and WWL during program operation of the floating gate cell (432 or 434), thus injecting electrons into the floating gate. FIG. 10B shows a plot 1050 of the VTH stored in the floating gate cell (432 or 434) at each step in FIG. 10B.

As depicted, for several initial steps (here, up to step 4), the balanced step pulse programming method (also mentioned in conjunction with FIGS. 9A and 9B) may be used to coarsely program the cell VTH to a value that does not exceed the target VTH. In some embodiments, the target VTH may be achieved up to these initial steps (up to steps 4) with acceptable margin. In some other embodiments, more precise programming to the target VTH may be necessary. In these embodiments, the difference between the current VTH and target VTH may be less than the available increasement of the VTH at each step (delta in FIG. 10B). Then, subsequent constant pulse programming steps are applied further to accurately program the VTH.

In embodiments, the subsequent constant pulse programming steps use a reduced programming pulse height (by alpha in FIG. 10A) but an increased pulse width (T_pulse*n, n is not less than 1.0), to set the VTH at the target. As a result, the programming scheme in FIGS. 10A-10B can control the final programmed cell threshold voltage below available voltage step (=delta) generated from on-chip voltage references from the target VTH.

Figure 11:
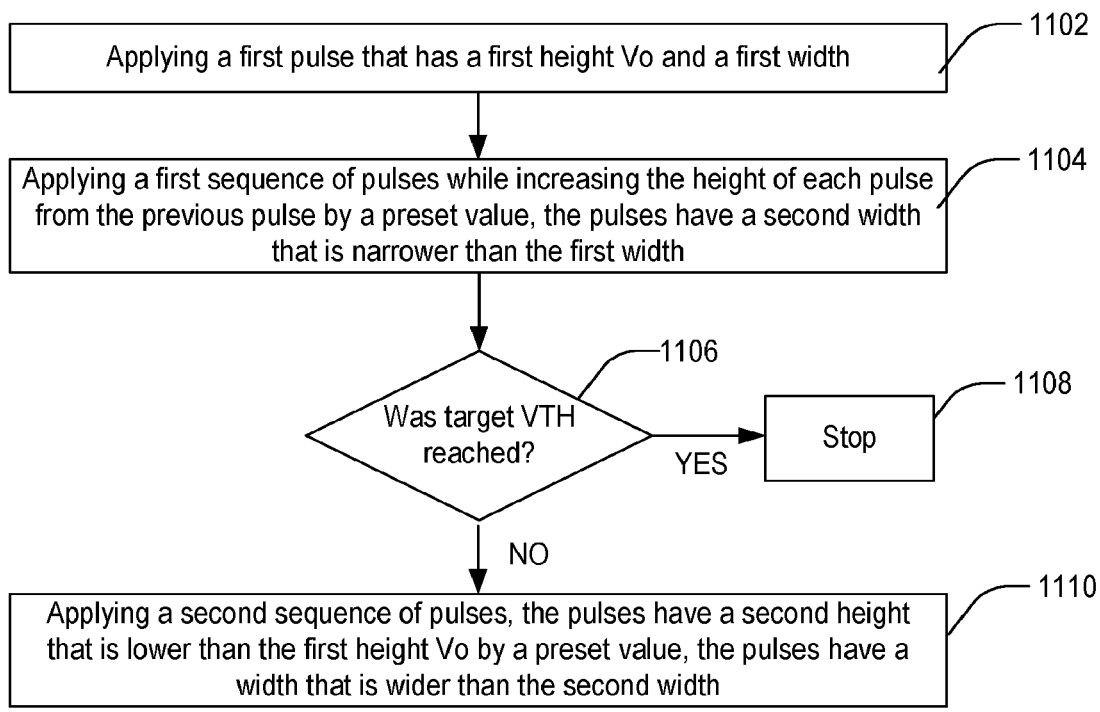
FIG. 11 shows a flow chart of an illustrative process for programming a threshold voltage (VTH) of a floating gate node according to embodiments of the present disclosure.

FIG. 11 shows a flow chart 1100 of an illustrative process for programming threshold voltage (VTH) of a floating gate node according to embodiments of the present disclosure. At step 1102, a voltage pulse (e.g., step 1 in FIG. 10A) having a first height (e.g., VPGM) and the first width (T_pulse*m, m is not less than 1.0) may be applied to the PWL and WWL terminals of a floating gate cell (432 or 434), thus injecting electrons into the floating gate. At step 1104, a first sequence of voltage pulses (such as steps 2-4 in FIG. 10A) may be applied to the PWL and WWL terminals while increasing the height of each pulse from the previous pulse by a preset value (e.g., delta).

At step 1106, it may be determined whether the target VTH was reached after applying the first sequence of pulses. If the answer to the determination is positive, the process proceeds to step 1108. At step 1108, the process stops. Otherwise, at step 1110, a second sequence of voltage pulses (such as steps 5-19 in FIG. 10A) may be applied to the PWL and WWL terminals. In embodiments, each pulse of the second sequence of pulses may have a width (T_pulse*n, n is not less than 1.0) that is not narrower than the pulse in the previous steps (T_pulse). In embodiments, the second sequence of pulses have a height that is lower than the first height (VPGM−alpha), and the second sequence of pulses have a width (T_pulse*n) that is not narrower than the second width (T_pulse). In embodiments, by way of example, the values may be m=9.0, n=5.0, alpha=0.8V, delta=0.1V, and VPGM=7.2V.

It is noted that the methods for programming VTH of the floating gate node in FIGS. 9A-11 may be applied to the cells 732 and 734. More specifically, the method associated with column 912 in FIG. 9A and/or the method described in conjunction with FIGS. 10A-10B may be used to program VTH of the cells 732 and 734.

Each synapse in FIGS. 3-8 may generate two output signals through two output signal lines BL and BLB, where the differential signaling technique may be applied to generate the two output signals. The differential signaling may reduce the sensitivity to transistor offsets and common mode noise from supply voltage and temperature variations that can introduce serious errors to the output current in prior art designs of synapses or devices for weighted sum computations.

Figure 12A:
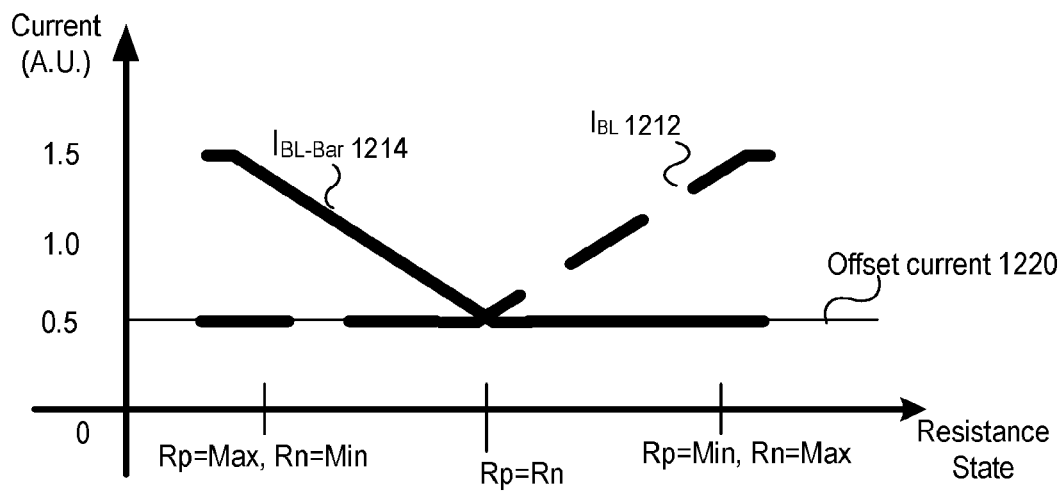
FIG. 12A-12C illustrates differential signaling according to embodiments of the present disclosure.
Figure 12B:
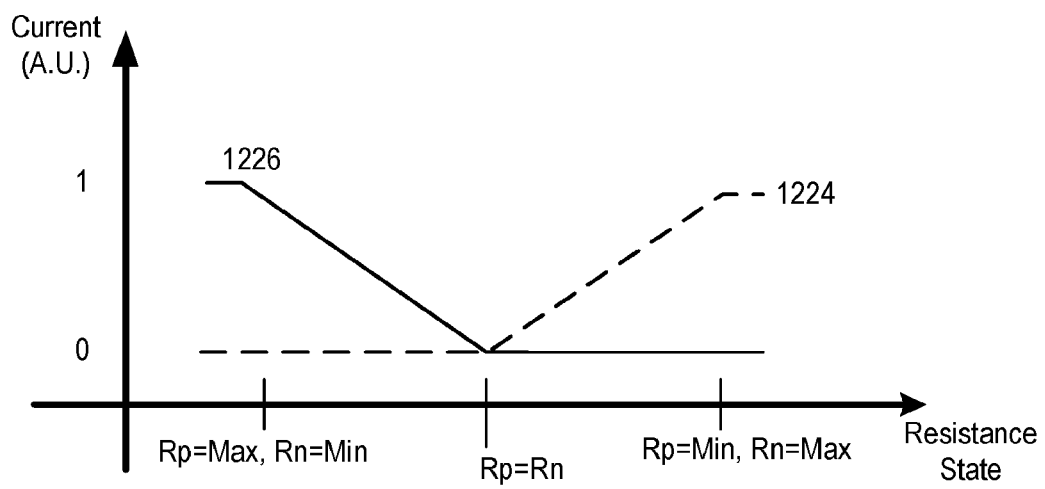
Figure 12C:
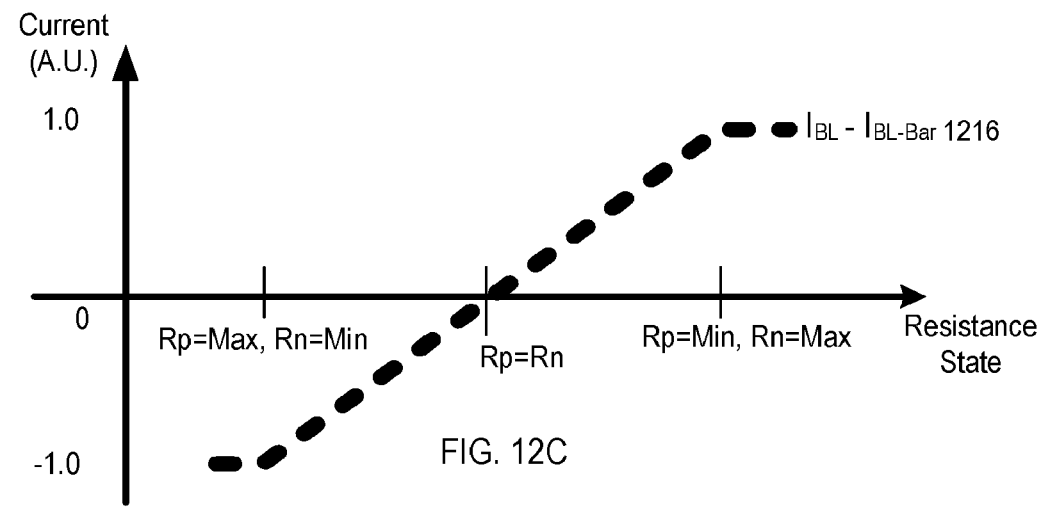

FIG. 12A-12C illustrates differential signaling according to embodiments of the present disclosure. As depicted in FIG. 12A, the $I_{BL}$ line 1212 and $I_{BL\text{-}Bar}$ line 1214 may be the output currents through the output signal lines BL (e.g., 106) and BLB (e.g., 107) of a synapse, respectively. By way of example, each output current may range from a minimum of 0.5 (A.U.) to a maximum of 1.5 (A.U.), depending on the resistance values of R_p and R_n. In the embodiments, $I_{BL}$ line 1212 may be a sum of a first current signal 1224 and an offset current signal 1220, while the $I_{BL}$ line 1214 may be a sum of the offset current 1220 and the second current signal 1226. As depicted, the offset current 1220 may include transistor offsets and common mode noise.

As depicted in FIG. 12B, by applying the differential signaling technique on the two output signal lines 1212 and 1214, the offset current 1220 may be canceled, and the values of output current signals 1224 and 1226 may be obtained. By way of example, the output current signals 1224 and 1226 may range from 0.0 (A.U.) to 1.0 (A.U.).

Furthermore, in embodiments, the first current signal 1224 may have an opposite polarity to the second current signal 1226. By using differential signaling on the two output currents, as depicted in FIG. 12C, the difference between the two signals, $I_{BL}-I_{BL\text{-}Bar}$ 1216, may range from the minimum of −1.0 to a maximum of +1.0, i.e., the range of the combined signal may be twice as large as the range of a single output.

Figure 13:
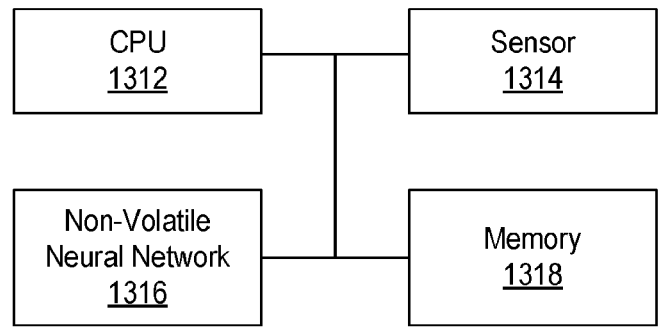
FIG. 13 shows a schematic diagram of a chip that includes a neural network according to embodiments of the present disclosure.

FIG. 13 shows a schematic diagram of a chip 1300 that includes a neural network according to embodiments of the present disclosure. As depicted, the chip 1300 may have a system-on-chip structure and include: non-volatile neural network 1316; a CPU 1312 for controlling the elements on the chip 1300; a sensor 1314 for providing input signals to the non-volatile neural network 1316; and a memory 1318. In embodiments, the neural network 1316 may be similar to the neural network 100 in FIG. 1. In embodiments, the chip 1300 may be a silicon chip and the components 1312-1318 may be integrated on the chip 1300.

Figure 14:
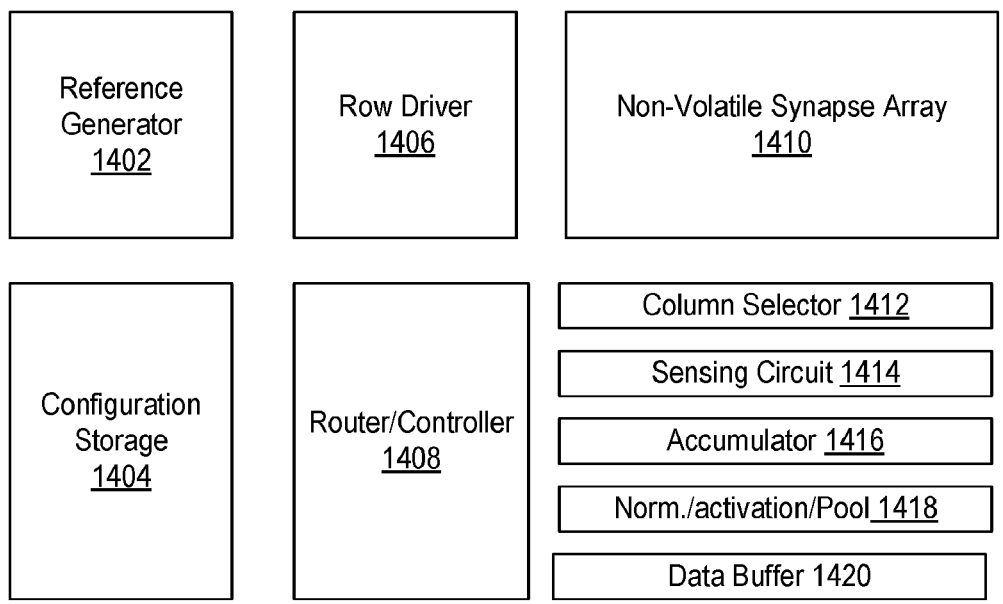
FIG. 14 shows a schematic diagram of a neural network that includes a non-volatile synapse array according to embodiments of the present disclosure.

FIG. 14 shows a schematic diagram of a system 1400 for operating a non-volatile synapse array according to embodiments of the present disclosure. As depicted, the system 1400 may include: a non-volatile synapse array 1410; a reference generator 1402; a configuration storage 1404; a row driver 1406 for selecting a row of synapses among the non-volatile synapse array 1410; a router/controller 1408; a column selector 1412 for selecting a column of synapses among the non-volatile synapse array 1410; a sensing circuit 1414; an accumulator 1416 for collecting output values from the non-volatile synapse array 1410; normalization/activation/pooling function block 1418; and a data buffer 1420 for buffering data from the non-volatile synapse array 1410. In embodiments, the non-volatile synapse array 1410 may be similar to the non-volatile synapse array 200, and the sensing circuit 1414 may be similar to the sensing circuit 250 in FIG. 2.

The reference generator 1402 provides the voltage levels required by reference signals (e.g., SL in FIGS. 2-8) and input signal lines (e.g., WL in FIGS. 2-8) used by the row driver 1406. The configuration storage 1404 stores data for a finite state machine used by router/controller 1408, the physical mapping of weight parameters to synapse location within synapse array 200, as well as other configuration parameters for sensing circuits. In the embodiments, the configuration storage may be implemented as an on-chip non-volatile memory. The router/controller 1408 implements a finite state machine to control the row selection sequences by the row driver 1406. Sensing circuits 1414 include voltage regulators and analog-digital converters to convert the output current signals from the selected columns into voltage signals and further into digital values. The result from a sensing circuit is summated in an accumulator 1416. Normalization/activation/pooling function blocks 1418 perform required signal processing operation on the accumulator value. Multiple dedicated DSPs or embedded CPU cores can be included to perform such numerical operations in parallel.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. The non-volatile synapse circuit in a memory device, said non-volatile synapse circuit comprising:
   a program line (418) for providing a programming signal;
   a write line (416) for providing a writing signal;
   an erase line (414) for providing an erasing signal;
   a reference line (412) for providing a reference signal;
   first and second output lines (BL, BLB) for carrying first and second output signals, respectively, and,
   a pair of memory cells (432,434) configured to generate the first and second output signals through the first and second output lines, respectively, wherein each memory cell includes:

a first upper select transistor (460) having a gate connected to a first input signal line (420) for providing a first input signal; and a first resistive changing element (452) connected in series between the first upper select transistor and the reference signal line, wherein the resistive changing element comprises:

a pair of coupling and write transistors (422, 424) configured to share a floating gate node, wherein the coupling transistor is connected to the program line and the write transistor is connected to the write line;

a read transistor (462) having a gate connected to the floating gate node; and a lower select transistor (464), connected in series with the read transistor, having a gate coupled to the erase line and a source coupled to the reference signal line, wherein the memory device comprises:

a row driver configured to select a group of synapse circuits in the array of the synapse circuits;

a controller configured to control the row driver to select the group of the synapse circuits;

a reference generator configured to simultaneously provide input voltage signals to local input lines coupled to the group of selected synapse circuits, wherein the first output line shared by the group of synapse circuits provides a summed current signal responsive to the simultaneously applied input voltage signals and the second output line shared by the group of selected synapse circuit provides a summed current signal responsive to the simultaneously applied input voltage signals; and a sensing circuit configured to receive the summed current signal in the first output line and the summed current signal in the second output line.

2. The non-volatile synapse circuit of claim 1, wherein the first output signal (1212) is a sum of a first current signal (1224) and an offset current signal (1220), the second output signal (1214) is a sum of a second current signal (1226) and the offset current signal (1220), and the first current signal has an opposite polarity to the second current signal.

3. The non-volatile synapse circuit of claim 1, wherein the row driver is further configured to provide a programming pulse sequence for the non-volatile synapse circuit, and wherein the programming pulse sequence comprises:

applying a first electrical pulse having a first height and a first width across the pair of transistors; and applying a first sequence of pulses across the pair of transistors while increasing a height of each pulse from a previous pulse by a preset value, each pulse of the first sequence of pulses having a second width that is not wider the first width, to thereby program a voltage on the floating gate node.

4. The non-volatile synapse circuit of claim 3, wherein the row driver is further configured to continues applying a second sequence of pulses having a second height that is lower than the first height by a preset value, each pulse of the second sequence of pulses having a width that is not narrower than the second width until the threshold voltage of the non-volatile synapse circuit reaches a target level.

5. The non-volatile synapse circuit in a memory device, said non-volatile synapse circuit comprising:

a program line (418) for providing a programming signal;
a write line (416) for providing a writing signal;
an erase line (414) for providing an erasing signal;
a reference line (412) for providing a reference signal;
first and second output lines (BL, BLB) for carrying first and second output signals, respectively, and, a pair of memory cells (432,434) configured to generate the first and second output signals through the first and second output lines, respectively, wherein each memory cell includes:

a first upper select transistor (460) having a gate connected to a first input signal line (420) for providing a first input signal; and a first resistive changing element (452) connected in series between the first upper select transistor and the reference signal line, wherein the resistive changing element comprises:

a pair of coupling and write transistors (422, 424) configured to share a floating gate node, wherein the coupling transistor is connected to the program line and the write transistor is connected to the write line;

a read transistor (462) having a gate connected to the floating gate node; and a lower select transistor (464), connected in series with the read transistor, having a gate coupled to the erase line and a source coupled to the reference signal line, wherein the memory synapse circuit further comprises a second input signal line for providing a second input signal; and wherein each of the pair of the memory cells (532,534) further includes:

a second upper select transistor having a gate coupled to the second input signal line; and a second resistive changing element having one end connected to the second upper select transistor in series and an other end coupled to the reference line.

6. The non-volatile synapse circuit of claim 5, wherein a drain of the second upper select transistor of a first of the pair of memory cells (532) is coupled to the first output line and a drain of the second upper select transistor of the second cell (534) is coupled to the second output line.

7. The non-volatile synapse circuit of claim 5, wherein the first output signal (1212) is a sum of a first current signal (1224) and an offset current signal (1220), the second output signal (1214) is a sum of a second current signal (1226) and the offset current signal (1220), and the first current signal has an opposite polarity to the second current signal.

8. The non-volatile synapse circuit in a memory device, said non-volatile synapse circuit comprising:

a program line (418) for providing a programming signal;
a write line (416) for providing a writing signal;
an erase line (414) for providing an erasing signal;
a reference line (412) for providing a reference signal;
first and second output lines (BL, BLB) for carrying first and second output signals, respectively, and, a pair of memory cells (432,434) configured to generate the first and second output signals through the first and second output lines, respectively, wherein each memory cell includes:

a first upper select transistor (460) having a gate connected to a first input signal line (420) for providing a first input signal; and a first resistive changing element (452) connected in series between the first upper select transistor and the reference signal line, wherein the resistive changing element comprises:

a pair of coupling and write transistors (422, 424) configured to share a floating gate node, wherein the coupling transistor is connected to the program line and the write transistor is connected to the write line;

a read transistor (462) having a gate connected to the floating gate node; and a lower select transistor (464), connected in series with the read transistor, having a gate coupled to the erase line and a source coupled to the reference signal line, wherein said circuit further comprise a second input signal line (WLB) for providing a second input signal;

wherein the pair of the memory cells (632, 634) includes second upper select transistors (606, 608), respectively, having a gate connected to the second input signal line;

wherein sources of the first upper select transistors (602, 604) and sources of the second upper select transistors (606, 608) are connected in parallel to the first resistive changing elements (613,614) in the memory cells (632, 634), respectively; and wherein drains of the second upper select transistors (604, 606) are coupled to the second output line (BLB) and drains of the first upper select transistors (602, 608) are coupled to the first output line (BL).

9. The non-volatile synapse circuit (800) of claim 8 further comprising:

a third input signal line for providing a third input signal;

a fourth input signal line for providing a fourth input signal; and, wherein each of first and second memory cells (832, 834) further includes:

a third upper select transistor having a gate coupled to the third input signal line; and a fourth upper select transistor having a gate that is electrically coupled to the fourth input signal line, the source of the third upper select transistor and the source of the fourth upper select transistor being directly connected to a second common node; and, a second resistive changing element having one end connected to the second common node and an other end electrically coupled to the reference signal line, a value of the second resistive changing element being programmable to change a magnitude of an output signal.

10. The non-volatile synapse circuit of claim 9, wherein a drain of the third upper select transistor of the first cell (832) is coupled to the first output line (BL) and a drain of the third upper select transistor of the second cell (834) is coupled to the second output line (BLB), and wherein a drain of the fourth upper select transistor of the first cell is coupled to the second output line and a drain of the fourth upper select transistor of the second cell is coupled to the first output line.

11. The non-volatile synapse circuit of claim 8, wherein the first output signal (1212) is a sum of a first current signal (1224) and an offset current signal (1220), the second output signal (1214) is a sum of a second current signal (1226) and the offset current signal (1220), and the first current signal has an opposite polarity to the second current signal.

* * * * *